United States Patent
Hayakawa (10) Patent No.: US 9,632,432 B2
(45) Date of Patent: Apr. 25, 2017

(54) EXPOSURE APPARATUS, STAGE APPARATUS, AND DEVICE FABRICATION METHOD FOR TRANSFERRING A PATTERN OF A RETICLE ONTO A SUBSTRATE

(71) Applicant: CANON KABUSHIKI KAISHA, Tokyo (JP)

(72) Inventor: Takashi Hayakawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 250 days.

(21) Appl. No.: 14/219,101

(22) Filed: Mar. 19, 2014

(65) Prior Publication Data

US 2014/0285791 A1 Sep. 25, 2014

(30) Foreign Application Priority Data

Mar. 19, 2013 (JP) .................. 2013-057303

(51) Int. Cl.
*G03F 7/20* (2006.01)

(52) U.S. Cl.
CPC .......... *G03F 7/70725* (2013.01); *G03F 7/707* (2013.01); *G03F 7/70708* (2013.01); *G03F 7/70733* (2013.01)

(58) Field of Classification Search
CPC ............. G03F 7/70725; G03F 7/70733; G03F 7/70491; G03F 7/70683; G03F 7/70691; G03F 7/707; G03F 7/70708; G03F 7/70741
See application file for complete search history.

(56) References Cited

U.S. PATENT DOCUMENTS

| | | | |
|---|---|---|---|
| 5,909,030 A | 6/1999 | Yoshitake et al. | |
| 6,710,850 B2 | 3/2004 | Yamaguchi et al. | |
| 2002/0039178 A1* | 4/2002 | Takeishi | G03B 27/42 355/53 |

FOREIGN PATENT DOCUMENTS

| | | |
|---|---|---|
| JP | H1055944 A | 2/1998 |
| JP | H11162809 A | 6/1999 |
| JP | 2002289514 A | 10/2002 |
| JP | 2002299231 A | 10/2002 |
| JP | 2003257819 A | 9/2003 |
| JP | 2004140271 A | 5/2004 |
| JP | 2006049919 A | 2/2006 |
| JP | 2007115992 A | 5/2007 |
| JP | 2010-198315 A | 9/2010 |

* cited by examiner

*Primary Examiner* — Michelle M Iacoletti
(74) *Attorney, Agent, or Firm* — Rossi, Kimms & McDowell LLP (57) ABSTRACT

The present invention provides an exposure apparatus which transfers a pattern of a reticle onto a substrate, including a stage configured to place the reticle, a holding mechanism configured to hold the reticle placed on the stage, a driving unit configured to drive the stage, a determination unit configured to determine a feature including at least one of a type or shape of the reticle placed on the stage, and a decision unit configured to decide, based on the feature determined by the determination unit, at least one of a holding state of the reticle held by the holding mechanism, or control regarding driving of the stage.

25 Claims, 5 Drawing Sheets

EXPOSURE APPARATUS, STAGE APPARATUS, AND DEVICE FABRICATION METHOD FOR TRANSFERRING A PATTERN OF A RETICLE ONTO A SUBSTRATE

BACKGROUND OF THE INVENTION

Field of the Invention

The present invention relates to an exposure apparatus, stage apparatus, and device fabrication method.

Description of the Related Art

An exposure apparatus for fabricating a semiconductor device includes a reticle stage for holding and positioning a reticle (mask), and a substrate stage for holding and positioning a substrate. In a step-and-scan exposure apparatus (scanner) which is currently mainstream, the reticle stage and substrate stage repeat acceleration and deceleration to move and stop for each shot region on a substrate.

In such an exposure apparatus, the processing velocity (throughput) is increased by increasing the accelerations of the reticle stage and substrate stage in order to increase the productivity. As the accelerations of the stages increase, forces acting on a reticle and substrate held by the stages increase. In particular, the reticle stage moves at an acceleration higher than that of the substrate stage and thus requires a force (holding force) for holding a reticle against the acceleration. Recently, clamp holding of holding a reticle or substrate from its upper surface by a clamp is employed to enhance the holding force, in addition to conventional vacuum chuck.

There are various types of reticles and substrates held by the stages. For example, reticles include a general reticle (reticle obtained by drawing a circuit pattern on a glass substrate) used to fabricate a semiconductor device, and a special reticle used for a special purpose, for example, for a tool or measurement. Such special reticles include reticles of different shapes, materials, and masses, such as a reticle on which optical elements are arrayed on the upper or lower surface, and a reticle made of a metal. For the reticle on which optical elements are arrayed, the above-mentioned clamp holding cannot be adopted because the optical elements may be damaged. In some cases, the frequency characteristic changes depending on the difference in the material and mass of a reticle, and the stage may oscillate.

As a technique for suppressing oscillation of the stage caused by a change of the frequency characteristic, Japanese Patent Laid-Open No. 2010-198315 has proposed a method of changing the control parameters of a stage in accordance with the mass of a load mounted on an X-axis driving unit. In Japanese Patent Laid-Open No. 2010-198315, oscillation of the stage can be suppressed by setting optimal parameters for the stage in accordance with a change of the frequency characteristic.

However, the eigenvalue changes depending on the material of a reticle or substrate held by the stage. Thus, the resonance frequency of the stage may change to oscillate the stage. In this manner, the resonance frequency does not change depending on only the mass. Therefore, even if the control parameters are changed in accordance with the mass, as in the technique in Japanese Patent Laid-Open No. 2010-198315, oscillation of the stage cannot be completely suppressed. When the reticle can neither be clamped nor held, and the stage is moved at a high acceleration, this may cause: a positional shift of the reticle or damage to the reticle.

SUMMARY OF THE INVENTION

The present invention provides a technique advantageous for holding an object such as a reticle or substrate.

According to one aspect of the present invention, there is provided an exposure apparatus which transfers a pattern of a reticle onto a substrate, including a stage configured to place the reticle, a holding mechanism configured to hold the reticle placed on the stage, a driving unit configured to drive the stage, a determination unit configured to determine is feature including at least one of a type or shape of the reticle placed on the stage, and a decision unit configured to decide, based on the feature determined by the determination unit, at least one of a holding state of the reticle held by the holding mechanism, or control regarding driving of the stage.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
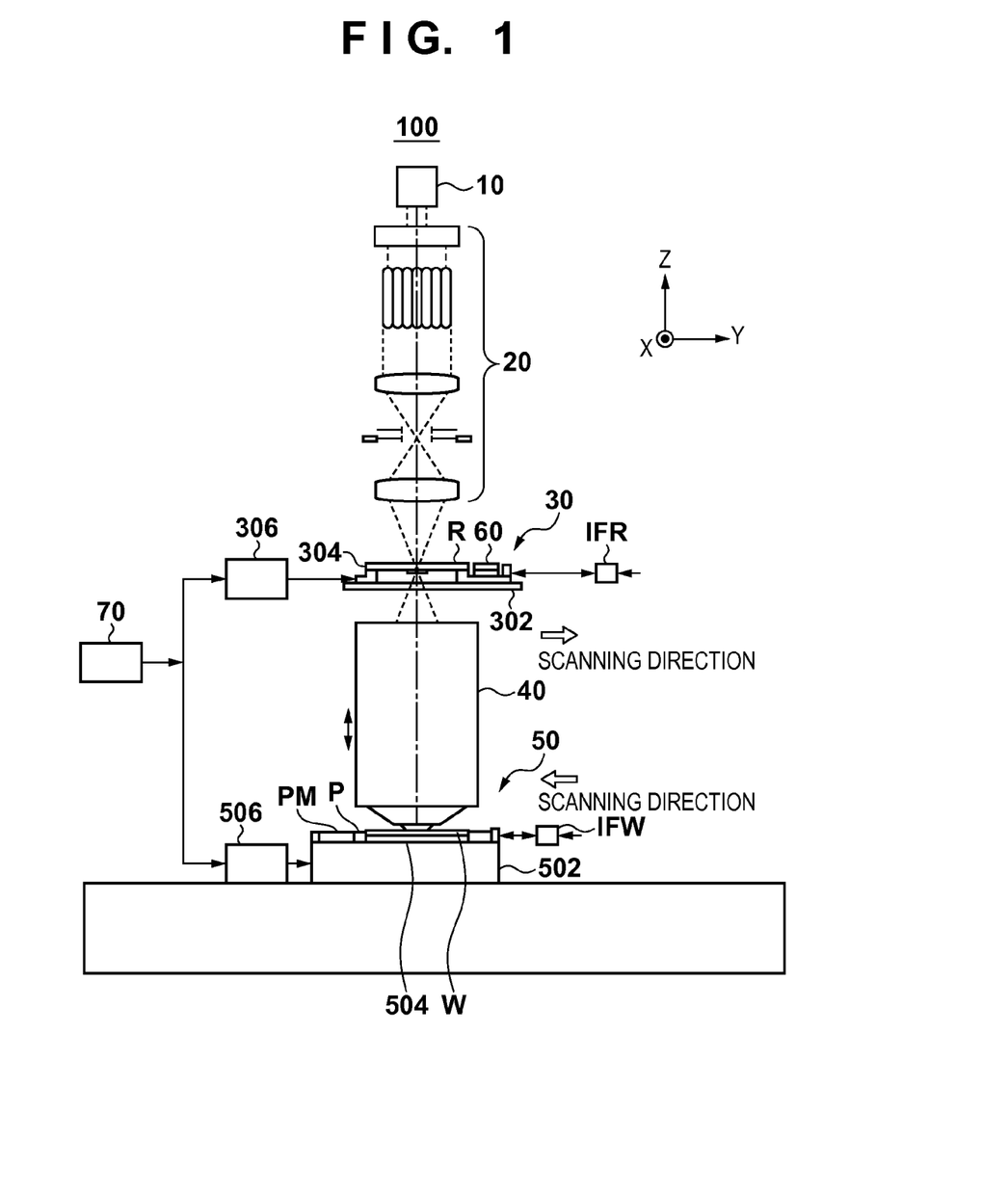
FIG. 1 is a schematic view showing the arrangement of an exposure apparatus as one aspect of the present invention.

FIG. 1 is a schematic view showing the arrangement of an exposure apparatus 100 as one aspect of the present invention. The exposure apparatus 100 is a lithography apparatus which transfers the pattern of a reticle (mask) onto a substrate by a step-and-scan method. However, a step-and-repeat method or another exposure method is also applicable to the exposure apparatus 100.

The exposure apparatus 100 includes an illumination optical system 20 which illuminates a reticle R with light from a light source 10, a reticle stage apparatus 30 for positioning the reticle R, and a projection optical system 40 which projects the pattern of the reticle R onto a substrate W. The exposure apparatus 100 also includes a substrate stage apparatus 50 for positioning the substrate W, a determination unit 60, and a control unit 70.

The reticle stage apparatus 30 positions the reticle R by moving the reticle R in the Y-axis direction. In the embodiment, the reticle stage apparatus 30 includes a reticle stage 302 on which the reticle R serving as a holding target (object) is placed, a holding mechanism 304 which holds the reticle R placed on the reticle stage 302, and driving units 306 which drive the reticle stage 302. An interferometer IFR continuously measures the position of the reticle stage 302, and the control unit 70 controls it at high accuracy.

Figure 2:
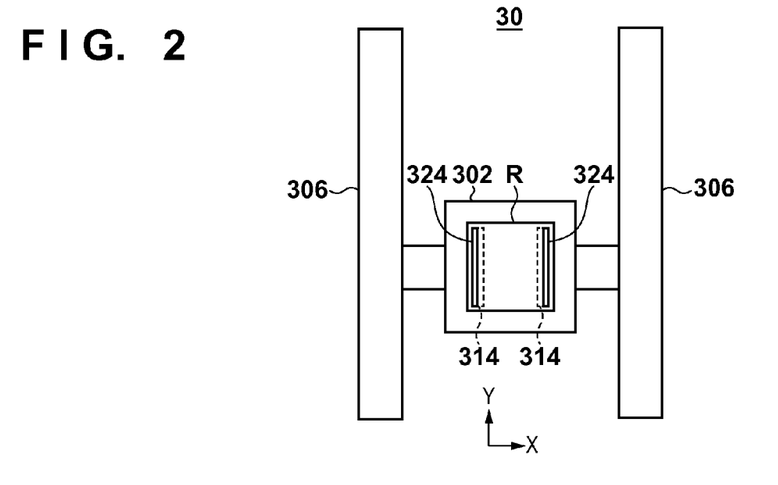
FIG. 2 is a schematic view showing the arrangement of the reticle stage apparatus of the exposure apparatus shown in FIG. 1.

The arrangement of the reticle stage apparatus 30 will be explained in detail with reference to FIG. 2. In the reticle stage apparatus 30, the holding mechanism 304 includes suction mechanisms 314 which suck and hold (for example, vacuum-chuck) the reticle R via the reticle stage 302, and clamp mechanisms 324 which clamp and hold the reticle R from above the reticle stage 302. The holding mechanism 304 is configured to be able to change the holding state of the reticle R. In the embodiment, the hiding mechanism 304 can change the holding state of the reticle R to the first holding state or second holding state. The first holding state is a state in which the reticle R is sucked and held by the suction mechanisms 314. The second holding state is a state in which the reticle R is sucked and held by the suction mechanisms 314, and clamped and held by the clamp mechanisms 324. For example, when driving the reticle stage 302 at a high acceleration, the force (holding force) for holding the reticle R is insufficient, by only sucking and holding the reticle R by the suction mechanisms 314 (that is, in the first holding state), and the position of the reticle R shifts. To prevent this, in the embodiment, the holding force of the reticle R can be increased by sucking and holding the reticle R by the suction mechanisms 314, and clamping and holding it by the clamp mechanisms 324 (that is, by setting the second holding state).

The substrate stage apparatus 50 positions the substrate W by moving the substrate W in the X- and Y-axis directions. In the embodiment, the substrate stage apparatus 50 includes a substrate stage 502 on which the substrate W serving as a holding target (object) is placed, a holding mechanism 504 which holds the substrate W placed on the substrate stage 502, and a driving unit 505 which drives the substrate stage 502. An interferometer IFW continuously measures the position of the substrate stage 502, and the control unit 70 controls it at high accuracy.

The determination unit 60 determines the feature of the reticle R placed on the reticle stage 302. The determination unit 60 is constructed by, for example, a reading unit which reads an identifier such as a barcode formed on the reticle R. By reading the identifier of the reticle R, the determination unit 60 determines the feature of the reticle R. Also, the determination unit 60 may be constructed by an image sensing unit which senses the image of the reticle R, such as an area sensor, reflective sensor, or camera, and an image processing unit which processes an image sensed by the image sensing unit. In this case, the determination unit 60 may determine the feature of the reticle R based on an image processed by the image processing unit.

Figure 3:
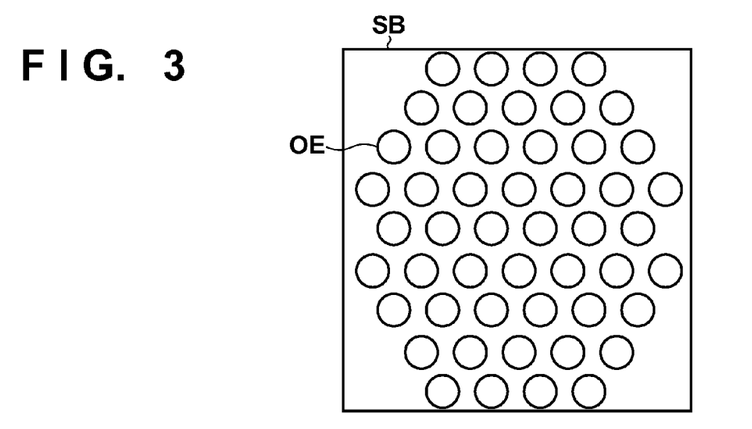
FIG. 3 is a view showing an example of the structure of a special reticle.

The feature of the reticle R includes, for example, at least one of the type of the reticle R or the shape of the reticle R. The type of the reticle R varies. Examples are a general reticle (reticle on which a circuit pattern is drawn) used to fabricate a semiconductor device, and a special reticle used for a special purpose. For example, the special reticle is a reticle on which optical elements OE are arrayed on the upper or lower surface of a base SB, as shown in FIG. 3. The special reticle may include various jigs and is not limited to a reticle on which a circuit pattern is formed.

Figure 4:
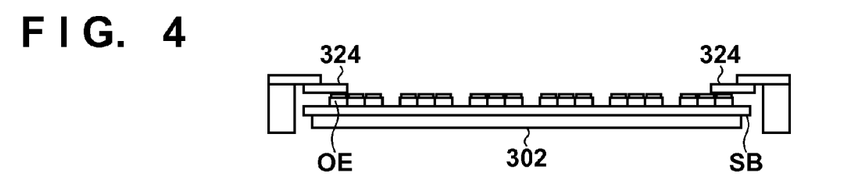
FIG. 4 is a view showing a state in which the special reticle is clamped and held by clamp mechanisms.

The control unit 70 includes a CPU and memory, and controls the overall (operation of the) exposure apparatus 100. The control unit 70 controls, via the respective units of the exposure apparatus 100, a process (for example, an exposure process) of transferring the pattern of the reticle R onto the substrate W. The control unit 70 also functions as a decision unit which decides, based on a reticle feature determined by the determination unit 60, at least one of the holding state of the reticle held by the holding mechanisms 304, or control regarding driving of the reticle stage 302. For example, as for control regarding driving of the reticle stage 302, the control unit 70 decides the driving profile of the reticle stage 302 which is driven by the driving unit 306, and control parameters which are set in the driving unit 306 in order to drive the reticle stage 302. As the holding state of the reticle, more specifically, the control unit 70 decides the first holding state or second holding state. For example, a case in which a special reticle (FIG. 3) on which the optical elements OE are arrayed on the upper or lower surface of the base SB is placed on the reticle stage 302 will be examined. In this case, if the special reticle placed on the reticle stage 302 is clamped and held by the clamp Mechanist 324, the optical elements OE on the base SB and the clamp mechanisms 324 interfere with each other, as shown in FIG. 4, damaging the optical elements OE (reticle). In this case, the control unit 70 decides the first holding state as the holding state of the reticle. The special reticle is sucked and held by only the suction mechanisms 314 without clamping and holding it by the clamp mechanisms 324.

An example of a process regarding control of the reticle stage apparatus 30 in the exposure apparatus 100 will be explained with reference to FIG. 5.

In step S502, the control unit 70 determines whether the reticle R has been placed on the reticle stage 302. If the reticle R has not been placed on the reticle stage 302, step S502 is repeated until the reticle R is placed on the reticle stage 302. If the reticle R has been placed on the reticle stage 302, the process shifts to step S504.

In step S504, the determination unit 60 determines the feature of the reticle R placed on the reticle stage 302. For example, the determination unit 60 determines the feature of the reticle R by reading an identifier formed on the reticle R and obtaining reticle information corresponding to the identifier, as described above. The reticle information is information representing the type and shape of the reticle. The reticle information is managed in advance in (for example, the storage unit of) the exposure apparatus 100 in correspondence with the identifier formed on the reticle R.

In step S506, based on the feature of the reticle R that has been determined in step S504, the control unit 70 determines whether the reticle R placed on the reticle stage 302 can be clamped and held. In other words, the control unit 70 decides the first holding state or second holding state as the holding state of the reticle R placed on the reticle stage 302. If the reticle R can be clamped and held, for example, if the reticle R placed on the reticle stage 302 is a general reticle, the process shifts to step S508. If the reticle R can be neither clamped nor held, for example, if the reticle R placed on the reticle stage 302 is a special reticle as shown in FIG. 3 (that is, a reticle which inhibits clamp holding), the process shifts to step S512.

In step S508, the control unit 70 controls the reticle stage apparatus 30 (holding mechanism 304) to suck and hold the reticle R by the suction mechanisms 314, and clamp and hold it by the clamp mechanisms 324, thereby setting the second holding state as the holding state of the reticle R.

In step S510, the control unit 70 sets, in the reticle stage apparatus 30 (driving unit 306), a high-velocity driving profile as the driving profile of the reticle stage 302. The high-velocity driving profile is a driving profile representing that the reticle stage 302 is driven at a high acceleration and high velocity.

In step S512, the control unit 70 controls the reticle stage apparatus 30 (holding mechanism 304) to suck and hold the reticle R by only the suction mechanisms 314 without clamping and holding it by the clamp mechanisms 324, thereby setting the first holding state as the holding state of the reticle R.

In step S514, the control unit 70 sets, in the reticle stage apparatus 30 (driving unit 306), a low-velocity driving profile as the driving profile of the reticle stage 302. The low-velocity driving profile is a driving profile representing that the reticle stage 302 is driven at a low acceleration and low velocity. In other words, when the first holding state is set as the holding state of the reticle R, the driving profile is decided so that the maximum acceleration of the reticle stage 302 in the first holding state becomes lower than that of the reticle stage 302 in the second holding state. In addition, the driving profile is decided so that the maximum velocity of the reticle stage 302 in the first holding state becomes lower than that of the reticle stage 302 in the second holding state.

Figure 5:
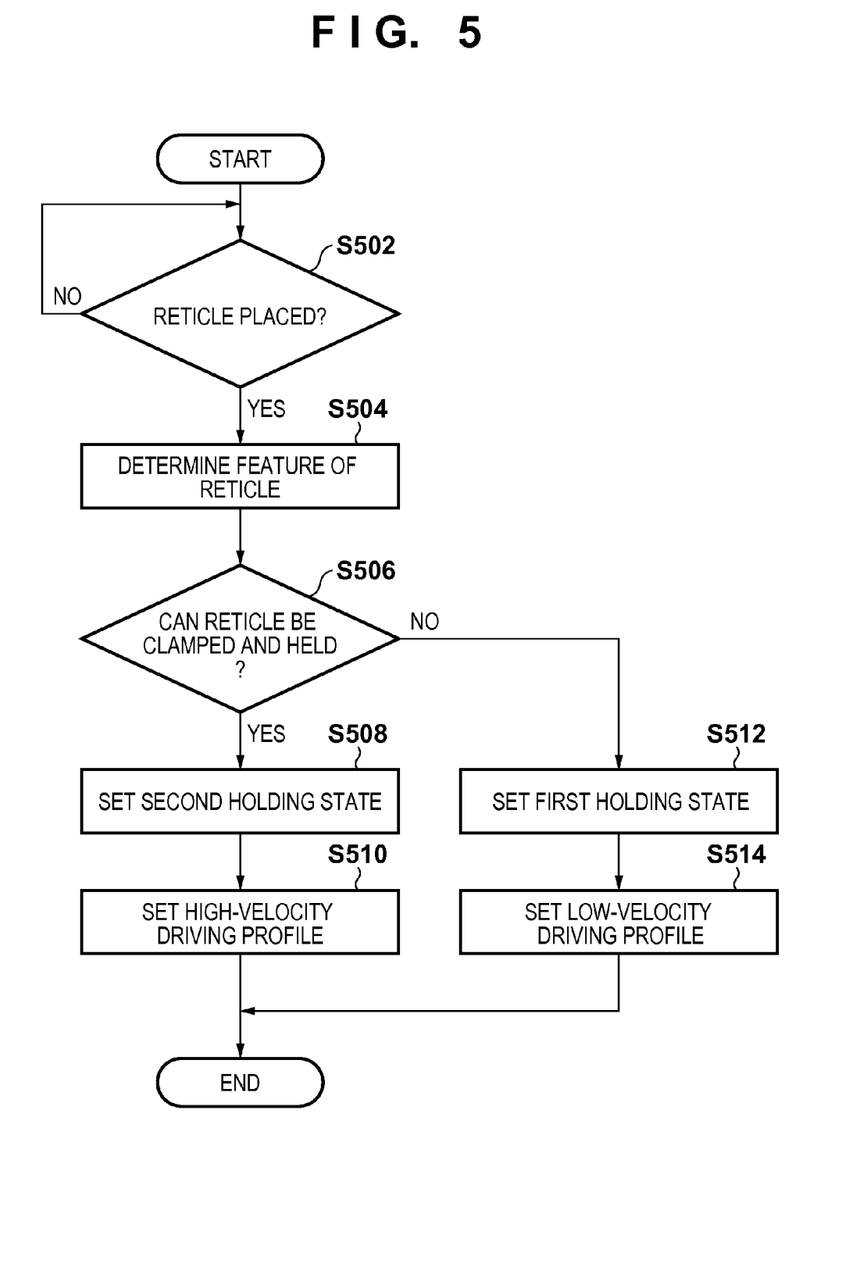
FIG. 5 is a flowchart for explaining an example of a process regarding control of the reticle stage apparatus in the exposure apparatus shown in FIG. 1.

By the process shown in FIG. 5, it can be prevented to erroneously clamp, hold, and damage reticle which can neither be clamped nor held. Also, it can be prevented to drive the reticle stage at a high acceleration and high velocity in the state (first holding state) in which a reticle is neither clamped nor held. Thus, a positional shift of the reticle and damage to it can be prevented. As for a reticle which can be clamped and held, the reticle can be clamped and held, and the reticle stage can be driven at a high acceleration and high velocity.

Figure 6:
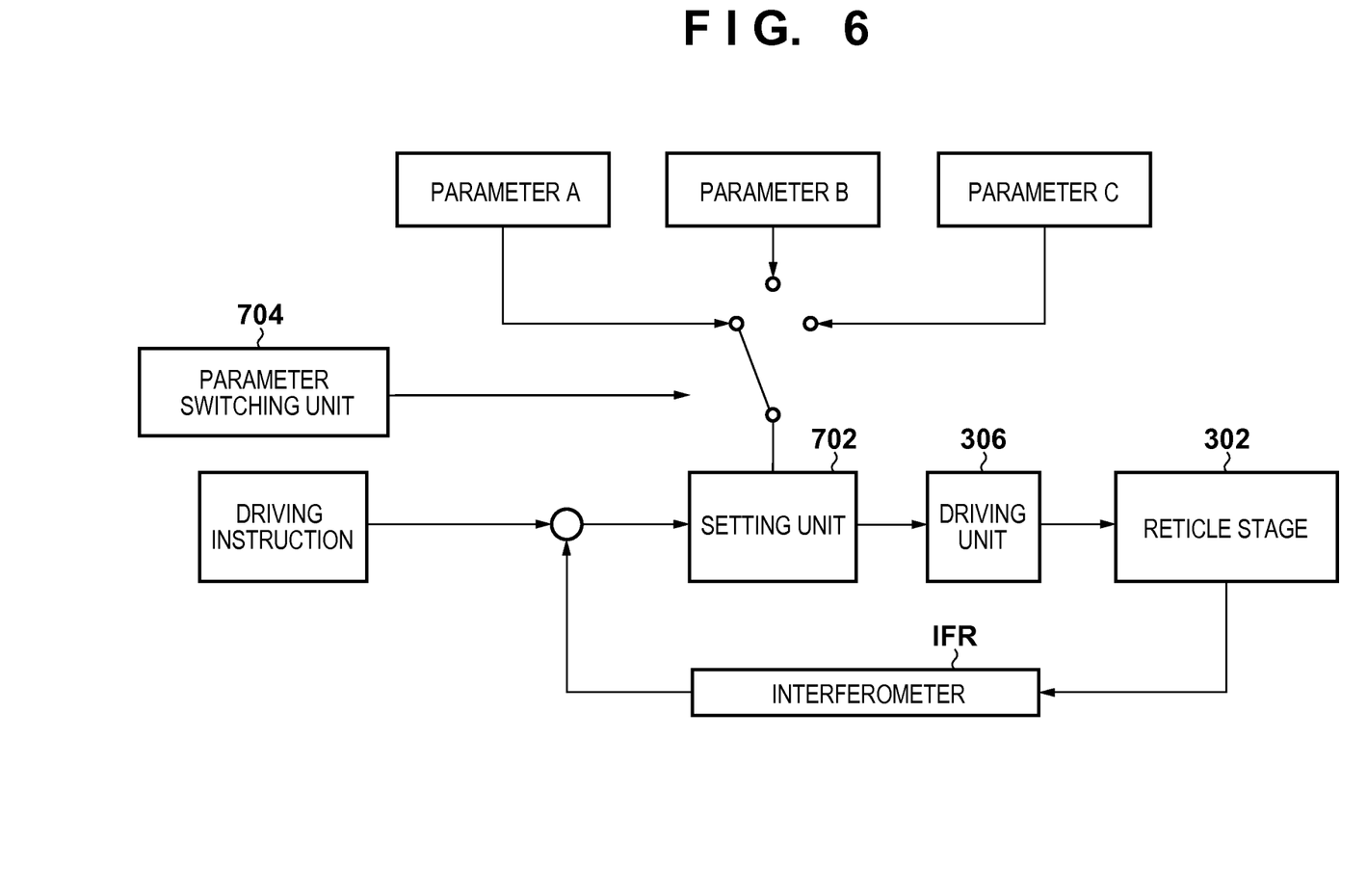
FIG. 6 is a block diagram Showing an example of the arrangement of the control unit of the exposure apparatus shown in FIG. 1.

FIG. 6 is a block diagram (control block diagram) showing an example of the arrangement of the control unit 70. The driving unit 306 constructed by an actuator or the like drives the reticle stage 302 serving as a control target. A setting unit 702 sets a PID gain, notch filter, and FF gain for stably controlling the reticle stage 302 with respect to the driving unit 306 at high accuracy in accordance with a driving instruction to drive the reticle stage 302. Parameters A, B, and C are control parameters (parameters for setting a PID gain, notch filter, and FF gain) optimized for each feature of a reticle placed on the reticle stage 302. A parameter switching unit 704 switches the parameters A to C to be set by the setting unit 702 in accordance with a reticle feature determined by the determination unit 60.

Another example of the process regarding control of the reticle stage apparatus 30 in the exposure apparatus 100 will be explained with reference to FIG. 7.

In step S702, the control unit 70 determines whether the reticle R has been placed on the reticle stage 302. If the reticle R has not been placed on the reticle stage 302, step S702 is repeated until the reticle R is placed on the reticle stage 302. If the reticle R has been placed on the reticle stage 302, the process shifts to step S704.

In step S704, the determination unit 60 determines the feature of the reticle R placed on the reticle stage 302.

In step S706, the control unit 70 determines whether control parameters (that is, parameters for setting a PID gain, notch filter, and FF gain) corresponding to the feature of the reticle R that has been determined in step S704 have been stored. The control parameters are managed in advance in (for example, the storage unit of) the exposure apparatus 100 in correspondence with the feature of the reticle R (that is, the identifier formed on the reticle R). If the control parameters have been stored, the process shifts to step S708. If the control parameters have not been stored, the process shifts to step S712.

In step S708, the control unit 70 obtains control parameters corresponding to the feature of the reticle R that has been determined in step S704.

In step S710, the control unit 70 sets, in the driving unit 306, the control parameters obtained in step S708.

In step S712, based on the feature of the reticle R that has been determined in step S704, the control unit 70 determines whether the reticle R placed on the reticle stage 302 can be clamped and held. If the reticle R can be clamped and held, the process shifts to step S714. If the reticle R can be neither clamped nor held, the process shifts to step S718.

In step S714, the control unit 70 controls the reticle stage apparatus 30 (holding mechanism 304) to suck and hold the reticle R by the suction mechanisms 314, and clamp and hold it by the clamp mechanisms 324, thereby setting the second holding state as the holding state of the reticle R.

In step S716, the control unit 70 sets, in the reticle stage apparatus 30 (driving unit 306), a high-velocity driving profile as the driving profile of the reticle stage 302.

In step S718, the control unit 70 controls the reticle stage apparatus 30 (holding mechanism 304) to suck and hold the reticle R by only the suction mechanisms 314 without clamping and holding it by the clamp mechanisms 314, thereby setting the first holding state as the holding state of the reticle R.

In step S720, the control unit 70 sets, in the reticle stage apparatus 30 (driving unit 306), a low-velocity driving profile as the driving profile of the reticle stage 302.

In step S722, the control unit 70 decides the control parameters (that is, parameters for setting a PID gain, notch filter, and FF gain) based on the feature of the reticle R that has been determined in step S704. For example, based on the oscillation frequency of the reticle stage 302, the control unit 70 decides a notch filter corresponding to (the feature of) the reticle R placed on the reticle stage 302. Based on the driving deviation of the reticle stage 302, the control unit 70 decides a FF gain corresponding to (the feature of) the reticle R placed on the reticle stage 302.

In step S724, the control unit 70 sets, in the driving unit 306, the control parameters decided in step S722.

In step S726, the control unit 70 stores the control parameters decided in step S722 in (for example, the storage unit of) the exposure apparatus 100 in correspondence with the feature of the reticle R that has been determined in step S704.

Figure 7:
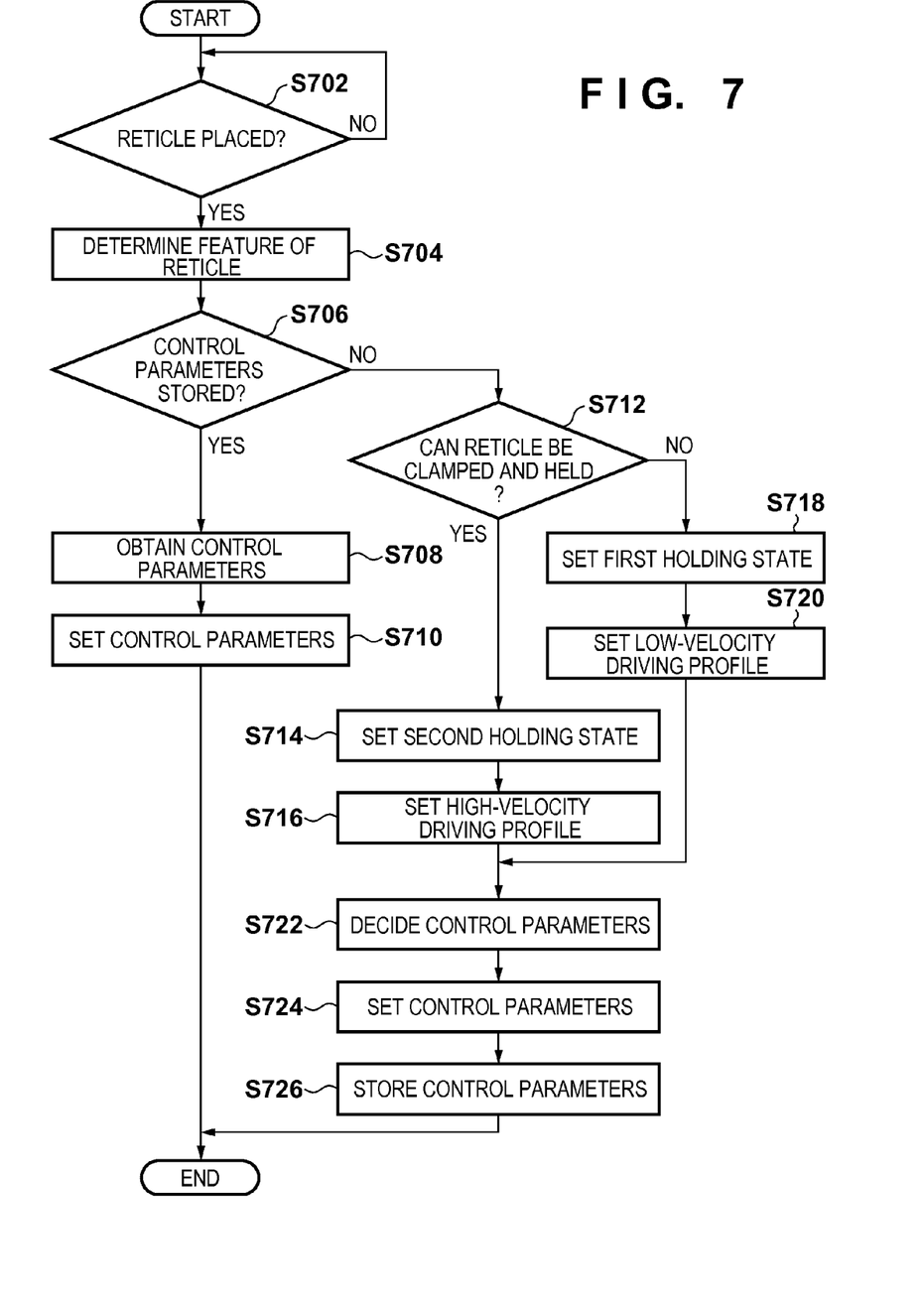
FIG. 7 is a flowchart for explaining another example of the process regarding control of the reticle stage apparatus in the exposure apparatus shown in FIG. 1.

According to the process shown in FIG. 7, even when the reticles R having different eigenvalues are placed on the reticle stage 302 while replacing them, control parameters corresponding to each reticle can be set in the driving unit 306. Oscillation of the reticle stage 302 can therefore be prevented.

As described above, the exposure apparatus 100 according to the embodiment can prevent damage to the reticle R when the reticle R placed on the reticle stage 302 is held, and a positional shift of the reticle R during driving of the reticle stage 302. Further, the exposure apparatus 100 can drive, at an acceleration and velocity corresponding to the reticle R, the reticle stage 302 on which the reticle R is placed. The exposure apparatus 100 can also prevent oscillation of the reticle stage 302. While suppressing a decrease in throughput, the exposure apparatus 100 can transfer the pattern of the reticle R onto the substrate W at high accuracy. Hence, the exposure apparatus 100 can provide a low-cost, high-quality device (for example, a semiconductor device, liquid crystal display device, or flat panel display (FPD)) at a high throughput. Such a device can be fabricated through a step of exposing, by using the exposure apparatus 100, a substrate (for example, a wafer or glass plate) on which a photoresist (photosensitive agent) is applied, a step of performing a development process for the substrate exposed, and other well-known steps.

Although the embodiment, has exemplified a reticle stage apparatus which holds a reticle, the present invention is also applicable to a substrate stage apparatus which holds a substrate. The embodiment has exemplified a case in which the exposure apparatus includes the suction mechanism for sucking and holding a reticle, and the clamp mechanism for clamping and holding a reticle. However, even when the exposure apparatus does not include the clamp mechanism, the acceleration and velocity may be changed in accordance with the holding state of the reticle.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-057303 filed on Mar. 19, 2013, which is hereby incorporated by reference herein in its entirety.

What is claimed is:

1. An exposure apparatus configured to transfer a pattern of a reticle onto a substrate, comprising:
    a stage configured to receive the reticle;
    a holding mechanism configured to hold the reticle placed on the stage;
    a driving unit configured to drive the stage; and
    a selection unit configured to select, based on information related to a type of the reticle placed on the stage, one of holding states of the reticle held by the holding mechanism and one of control parameters set in the driving unit to drive the stage.

2. The apparatus according to claim 1, wherein
    the holding mechanism includes a suction mechanism configured to suck the reticle via the stage, and a clamp mechanism configured to clamp the reticle from above the stage,
    the holding state of the reticle includes a first holding state in which the suction mechanism sucks the reticle without clamping the reticle by the clamp mechanism, and a second holding state in which the suction mechanism sucks the reticle and at the same time the clamp mechanism clamps the reticle, and
    the selection unit is configured to select one of the first holding state or the second holding state as the holding state of the reticle.

3. The apparatus according to claim 2, wherein, in a case where the information indicates that a reticle placed on the stage is a reticle on which optical elements are arrayed on an upper surface or lower surface, the selection unit is configured to select the first holding state as the holding state of the reticle.

4. The apparatus according to claim 3, wherein the selection unit is configured to further select one of driving profiles to set a maximum acceleration used when driving the stage in the first holding state, to be lower than a maximum acceleration used when driving the stage in the second holding state.

5. The apparatus according to claim 3, wherein the selection unit is configured to further select one of driving profiles to set a maximum velocity used when driving the stage in the first holding state, to be lower than a maximum velocity used when driving the stage in the second holding state.

6. The apparatus according to claim 1, further comprising a determination unit configured to determine the information.

7. The apparatus according to claim 6, wherein the determination unit includes a reading unit configured to read an identifier formed on the reticle, and is configured to determine the information based on the identifier read by the reading unit.

8. The apparatus according to claim 6, wherein the determination unit includes an image sensing unit configured to sense an image of the reticle and an image processing unit configured to process the image sensed by the image sensing unit,
    wherein the determination unit is configured to determine the information based on the image processed by the image processing unit.

9. The apparatus according to claim 1, wherein the control parameters include at least one of PID gain, notch filter, or FF gain.

10. An exposure apparatus configured to transfer a pattern of a reticle onto a substrate, comprising:
    a stage configured to receive the reticle;
    a holding mechanism including a suction mechanism configured to suck the reticle placed on the stage, and a clamp mechanism configured to clamp the reticle from above the stage;
    a driving unit configured to drive the stage; and
    a selection unit configured to select, based on information related to a type of the reticle placed on the stage, a holding state of the reticle held by the holding mechanism,
    wherein the holding state corresponds to one of where the suction mechanism sucks the reticle without clamping the reticle by the clamp mechanism, or where the suction mechanism sucks the reticle, and at the same time the clamp mechanism clamps the reticle.

11. The apparatus according to claim 10, wherein
    the information indicates whether the reticle placed on the stage is a reticle on which a circuit pattern is drawn or a reticle having a surface on which elements are arrayed, and
    in a case where the reticle placed on the stage is the special reticle, the selection unit is configured to select the holding state where the suction mechanism sucks the reticle without clamping the reticle by the clamp mechanism, and
    in a case where the reticle placed on the stage is the reticle on which the circuit pattern is drawn, the selection unit is configured to select the holding state where the suction mechanism sucks the reticle, and, at the same time, the clamp mechanism clamps the reticle.

12. The apparatus according to claim 11, wherein the selection unit is configured to select a driving profile to set a maximum acceleration used in driving the stage when the reticle is the reticle having a surface on which elements are arrayed, to be lower than a maximum acceleration used in driving the stage when the reticle is the reticle on which the circuit pattern is drawn.

13. The apparatus according to claim 10, further comprising a determination unit configured to determine the type of the reticle placed on the stage.

14. An exposure apparatus configured to transfer a pattern of a reticle onto a substrate, comprising:
    a stage configured to receive the reticle;
    a holding mechanism configured to hold the reticle placed on the stage;
    a driving unit configured to drive the stage; and a selection unit configured to select, based on information related to a type of the reticle placed on the stage, a driving profile including at least one of a maximum acceleration or maximum velocity when driving the stage in accordance with the information.

15. The apparatus according to claim 14, wherein
the information indicates whether the reticle placed on the stage is a reticle on which a circuit pattern is drawn or a reticle having a surface on which elements are arrayed, and
the selection unit is configured to select the driving profile to set a maximum acceleration used in driving the stage when the reticle is the special reticle, to be lower than a maximum acceleration used in driving the stage when the reticle is the reticle on which the circuit pattern is drawn.

16. The apparatus according to claim 14, further comprising a determination unit configured to determine the type of the reticle placed on the stage.

17. A device fabrication method comprising:
exposing a substrate using an exposure apparatus according to claim 14; and
performing a development process to develop the exposed substrate.

18. The apparatus according to claim 14, wherein
the information indicates whether the reticle placed on the stage is a reticle on which a circuit pattern is drawn or a reticle having a surface on which elements are arrayed, and
the selection unit is configured to select the driving profile to set a maximum velocity used in driving the stage when the reticle is the special reticle, to be lower than a maximum velocity used in driving the stage when the reticle is the reticle on which the circuit pattern is drawn.

19. An exposure apparatus configured to transfer a pattern of a reticle onto a substrate, comprising:
a stage configured to receive the reticle;
a holding mechanism configured to hold the reticle placed on the stage, and including a suction mechanism configured to suck the reticle placed on the stage and a clamp mechanism configured to clamp the reticle from above the stage;
a driving unit configured to drive the stage; and
a selection unit configured to select a first holding state in a case where the reticle held by the holding mechanism is a reticle on which optical elements are arrayed on an upper surface or a lower surface, or a second holding state in a case where the reticle held by the holding mechanism is a reticle on which a circuit pattern is drawn, the first holding state where the suction mechanism sucks the reticle without clamping, the second holding state where the suction mechanism sucks the reticle and the clamp mechanism clamps the reticle.

20. A device fabrication method comprising:
exposing a substrate using an exposure apparatus according to claim 19; and
performing a development process to develop the exposed substrate.

21. A device fabrication method comprising:
exposing a substrate using an exposure apparatus; and
performing a development process to develop the exposed substrate,
wherein the exposure apparatus is configured to transfer a pattern of a reticle onto a substrate and includes:
a stage configured to receive the reticle;
a holding mechanism configured to hold the reticle placed on the stage;
a driving unit configured to drive the stage; and
a selection unit configured to select, based on information related to a type of the reticle placed on the stage, one of holding states of the reticle held by the holding mechanism and one of control parameters set in the driving unit to drive the stage.

22. A device fabrication method comprising:
exposing a substrate using an exposure apparatus; and
performing a development process to develop the exposed substrate,
wherein the exposure apparatus configured to transfer a pattern of a reticle onto a substrate, comprising:
a stage configured to receive the reticle;
a holding mechanism including a suction mechanism configured to suck the reticle placed on the stage, and a clamp mechanism configured to clamp the reticle from above the stage;
a driving unit configured to drive the stage; and
a selection unit configured to select, based on information related to a type of the reticle placed on the stage, a holding state of the reticle held by the holding mechanism,
wherein the holding state corresponds to one of where the suction mechanism sucks the reticle without clamping the reticle by the clamp mechanism, or where the suction mechanism sucks the reticle, and at the same time the clamp mechanism clamps the reticle.

23. An exposure apparatus configured to transfer a pattern of a reticle onto a substrate, comprising:
a stage configured to receive the reticle;
a holding mechanism configured to hold the reticle placed on the stage;
a driving unit configured to drive the stage; and
a selection unit configured to select, based on information related to a type of the reticle placed on the stage, one of driving profiles of the stage driven by the driving unit, or one of control parameters set in the driving unit to drive the stage, or one of driving profiles of the stage driven by the driving unit and one of control parameters set in the driving unit to drive the stage.

24. A device fabrication method comprising:
exposing a substrate using an exposure apparatus according to claim 23; and
performing a development process to develop the exposed substrate.

25. The apparatus according to claim 23, wherein the control parameters include at least one of PID gain, notch filter, or FF gain.

* * * * *